(12) United States Patent
Hayward et al.

(10) Patent No.: US 6,349,041 B1
(45) Date of Patent: Feb. 19, 2002

(54) MODULAR CARD CAGE WITH CONTINUOUS EMI SHIELDING

(75) Inventors: C. Michael Hayward, Harvard; Richard N. Rehlander, Billerica; Paul J. Porreca, Marlboro, all of MA (US)

(73) Assignee: Hybricon Corporation, Ayer, MA (US)

( * ) Notice: Subject to any disclaimer, the term of this patent is extended or adjusted under 35 U.S.C. 154(b) by 0 days.

(21) Appl. No.: 09/328,279

(22) Filed: Jun. 8, 1999

Related U.S. Application Data

(60) Provisional application No. 60/088,667, filed on Jun. 9, 1998.

(51) Int. Cl.[7] ................................................. H05K 9/00
(52) U.S. Cl. ....................... 361/818; 361/753; 361/797; 361/800; 174/35 R; 312/265.5
(58) Field of Search ................................. 361/753, 796, 361/797, 800, 816, 818; 174/35 R, 35 GC; 211/41.17; 206/709; 312/265, 265.1–265.5, 223.2

(56) References Cited

U.S. PATENT DOCUMENTS

| | | | | |
|---|---|---|---|---|
| 3,885,701 A | * | 5/1975 | Becklin | 220/325 |
| 4,768,845 A | * | 9/1988 | Yeh | 312/257.1 |
| 5,046,791 A | * | 9/1991 | Kooiman | 312/265.1 |
| 5,120,903 A | * | 6/1992 | Tam | 174/35 GC |
| 5,394,305 A | | 2/1995 | Moral et al. | 361/776 |
| 5,715,146 A | | 2/1998 | Hoppal | 361/796 |
| 5,737,194 A | | 4/1998 | Hopkins et al. | 361/800 |

FOREIGN PATENT DOCUMENTS

| | | |
|---|---|---|
| DE | 90 15 069.4 U | 1/1991 |
| DE | 196 44 417 C1 | 8/1997 |
| EP | 0 306 694 A1 | 3/1989 |
| EP | 0 841 841 A | 5/1998 |

* cited by examiner

*Primary Examiner*—Jayprakash N. Gandhi
(74) *Attorney, Agent, or Firm*—Mills & Onello LLP

(57) ABSTRACT

A modular card cage allows for improved access to the rear panel of a backplane, while providing for enhanced EMI shielding. First and second side panels, in combination with top and bottom covers, form the card cage. The top and bottom covers are adapted for removably mounting to the side panels, and, when mounted, provide lateral rigidity to the card cage. At least one of the top and bottom covers comprises a front portion and a rear portion. The front portion of the cover is preferably separable from the rear portion such that one of the front and rear portions is removable from the side panels, while the other of the front and rear portions remains mounted for providing lateral rigidity. EMI shielding is provided in all portions of the cage, including the removably mounted covers, preferably by means of embedded, continuous gasketing. In this manner, a cost effective card cage is provided that is relatively simple to assemble and provides improved lateral and torsional rigidity over conventional configurations, while maintaining EMI shielding requirements.

20 Claims, 4 Drawing Sheets

FIG. 5A     FIG. 5B

MODULAR CARD CAGE WITH CONTINUOUS EMI SHIELDING

RELATED APPLICATIONS

This application claims the benefit of U.S. Provisional Application No. 60/088,667, filed Jun. 9, 1998, the contents of which are incorporated herein by reference in their entirety.

BACKGROUND OF THE INVENTION

Contemporary backplanes, also referred to as motherboards, serve as a communication medium for the exchange of electronic signals between a plurality of daughter cards. Each daughter card generates communication signals, for example, data bus signals, address bus signals, and control signals. The signals are distributed to connectors mounted along an edge of the daughter card. The daughter card connectors mate with a corresponding set of connectors on the backplane for providing electrical interconnects between each daughter card. The backplane distributes the signals between daughter cards along various communication paths as well as to input/output I/O connections via cable assemblies.

A chassis, commonly referred to as a "card cage", houses the backplane, daughter cards, and corresponding connectors. Backplane connectors are spaced on equidistant rows along the backplane, each row defining a card slot. Card guides are mounted, in pairs, one pair for each slot, along the top and bottom of the chassis for guiding an inserted daughter card to ensure proper mating of the connectors.

Contemporary card cages are commonly comprised of extruded rails supported at each end by side panels, or "side-plates". In addition to providing rigidity in the card cage, the rails serve to support the card guides. Each side panel includes precision-drilled holes that provide accurately-positioned locations for the mounting of the extrusion rails. A "U" dimension identifies the vertical position of the hole location (where U represents 1.75 inches). Card cages are commonly sized according to multiples of U units, for example, 3U, 6U, 9U, etc. The horizontal positions of the hole locations are commonly identified in multiples of millimeters, according to standard industry practice.

The extruded rails are configured to accept additional parts such as nut bars, adapted for securing front and rear panels, and backplanes, to the subrack. Attachment for the card guides is provided either by a spacer strip with punched holes, or by directly punching areas of the extrusion.

As electronics become more sophisticated, there is an ever-increasing demand on the backplane. It has recently become common for boards and connectors to not only be inserted at the front side of the backplane, at the connectors, but also at the rear side of the backplane, for example at the connector shrouds, to allow for increased communication, improved servicing, and more robust testing capability. Existing chassis configurations do not allow for convenient rear access because the rear chamber portion of the chassis, that is, the region of the card cage behind the backplane, must extend as far as the length of the largest rear-mounted daughter card, in order to protect the cards. When rear access is required by an operator or machine, the operator must reach deeply into the rear chamber in an awkward manner that is risky to both operator and nearby electronics. Additionally, a chassis employing side panels and lateral extrusions is difficult to assemble and install as they commonly require multiple-point fastener locations. Furthermore, such chassis are relatively weak and unstable, and they are subject to excessive rattling and vibration.

Along with physical demands, a card cage must meet the increased demands on electromagentic interference (EMI) shielding requirements. In general, as the frequency of system operation increases, signal wavelengths decrease, and so the minimum allowable gap in shielding likewise decreases. Many contemporary card cage configurations exhibit EMI shielding that is inadequate for modern electronics systems, both at frame joints and at seams.

SUMMARY OF THE INVENTION

The present invention is directed to a card cage assembly that overcomes the limitations described above. Specifically, the configuration of the present invention allows for improved access to the rear panel of the backplane, while providing for enhanced EMI shielding. In this manner, the present invention provides a cost effective card cage unit that is relatively simple to assemble and provides improved lateral and torsional rigidity over conventional configurations.

In a first aspect, the present invention is directed to an improved card cage configuration. First and second side panels, in combination with top and bottom covers, form the card cage. The top and bottom covers are adapted for removably mounting to the side panels, and, when mounted, provide lateral rigidity to the card cage. At least one of the top and bottom covers comprises a front portion and a rear portion. The front portion of the cover is preferably separable from the rear portion such that one of the front and rear portions is removable from the side panels, while the other of the front and rear portions remains mounted for providing lateral rigidity.

In a preferred embodiment, the front and rear portions of the cover each comprise lateral members for coupling the cover to the side panel, and a bridging member coupled between the lateral members. The bridging member preferably comprises first and second bridging sub-members spaced apart by a screening member. At least one of the bridging sub-members includes inserter/extractor leveraging apertures. The screening member preferably comprises EMI screening having apertures to permit air flow therethrough, while maintaining suitable EMI shielding.

The lateral members preferably comprise a slot for receiving an edge of the side panel so as to mount the lateral member on the side panel, and a seat parallel to the slot and orthogonally oriented relative to the slot for seating a surface of the bridging member relative to the lateral member. A face parallel to the slot includes mounting features for mounting the lateral member to the side panel. The seat and slot are preferably adapted for receiving an EMI gasket. The EMI gasket preferably comprises continuous tubular gasketing material. The bridging member of at least one of the front and rear portions preferably includes an EMI gasket substantially continuous across a portion of the interface of the front and rear portions to ensure proper EMI shielding across the length of the interface.

In a second aspect, the present invention is directed to a card cage having substantially continuous EMI shielding. First and second side panels and top and bottom covers together form the card cage. The top and bottom covers are adapted for removably mounting to the side panels for providing lateral rigidity to the card cage. The covers include lateral members for coupling the cover to the side panel. Each lateral member is adapted for interfacing with a feature of the side panel along the length of the lateral member so as to provide substantially continuous EMI shielding continuity therebetween. The covers further comprise a bridging member coupled between the lateral members. The bridging member is adapted for interfacing with a feature of the lateral member along the length of their intersection so as to provide substantially continuous EMI shielding continuity therebetween.

In a preferred environment, at least one of the top and bottom covers comprises a front portion and a rear portion. The front and rear portions are preferably separable from each other such that one of the front and rear portions is removable from the side panels while the other of the front and rear portions provides lateral rigidity.

In a third aspect, the present invention is directed to a ember for coupling a cover and side panel of a card cage. The member includes a body extending along a longitudinal axis of the member. A slot is formed in the body parallel to the longitudinal axis, for receiving an cage of a side panel. A seat is likewise formed in the body parallel to the longitudinal axis for receiving a cover positioned orthogonal to the side panel.

In a preferred embodiment, the slot includes a bore at a terminus of the slot adapted to receive a resilient EMI gasket to be embedded in the slot, for example a tubular gasket. The seat preferably includes a groove for receiving an edge of the cover. The groove preferably includes a bore at a terminus of the groove adapted to receive a resilient EMI gasket to be embedded in the groove.

The lateral member preferably further includes a locking feature adapted for removably securing the lateral member to a side panel. The locking feature may comprise a pin adapted to interface with a corresponding channel on the side panel.

DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 5A and 5B are close-up side views of the EMI shielding coupling between a side panel and a lateral member, in accordance with the present invention.

DETAILED DESCRIPTION OF PREFERRED EMBODIMENTS

Figure 1:
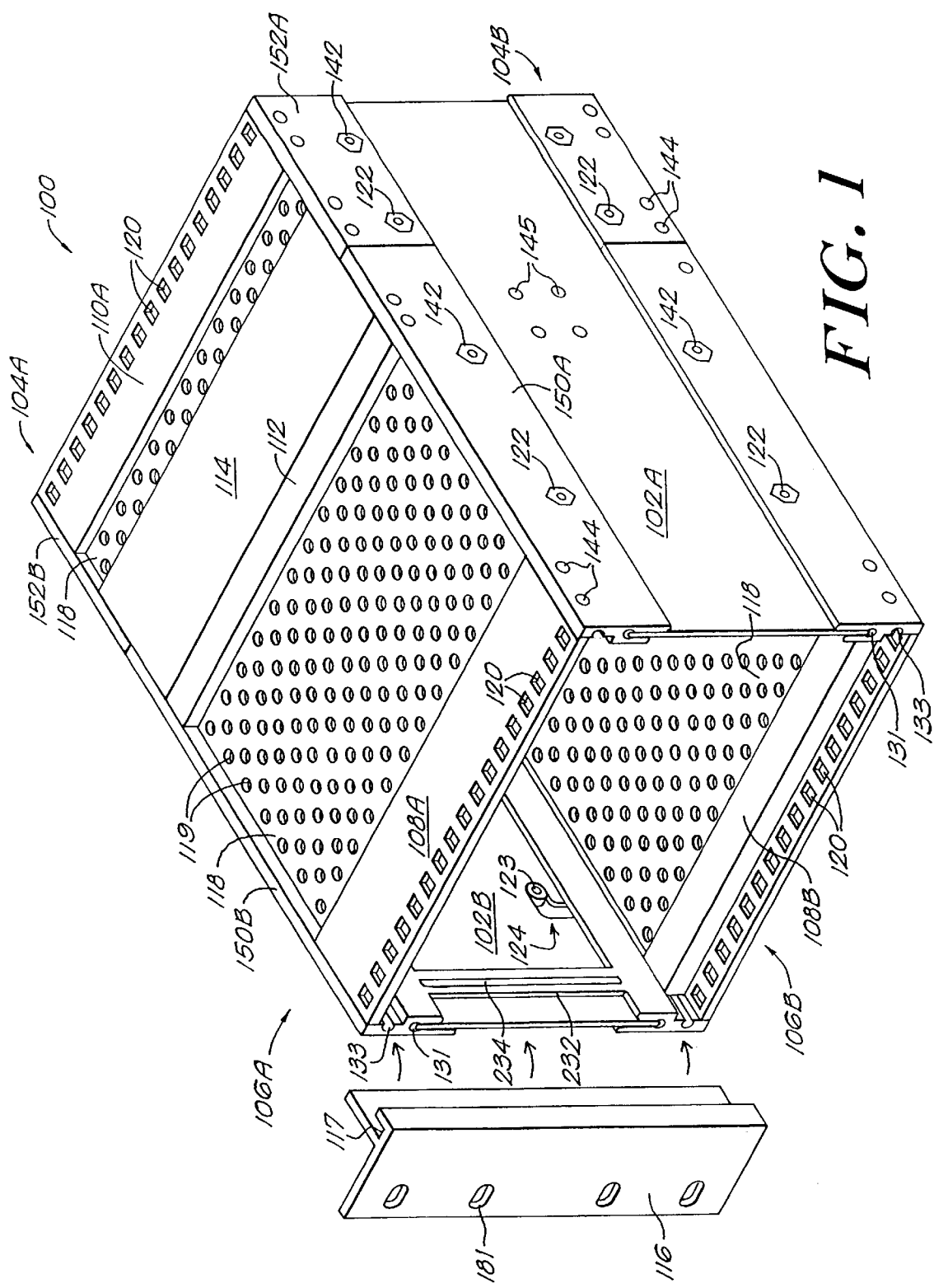
FIG. 1 is a perspective view of a preferred card cage assembly in accordance with the present invention.

FIG. 1 is a perspective view of an improved card cage configuration in accordance with the present invention. The card cage 100 comprises first and second side panels 102A, 102B, for example, formed of sheet metal. A top cover consists of a rear cover 104A and a front cover 106A. A corresponding bottom cover consists of a rear cover 104B and a front cover 106B. The covers are coupled to the side panels 102A so as to provide lateral rigidity to the card cage 100.

Each of the front covers 106A, 106B comprises first and second lateral members 150A, 150B joined by first and second bridging members 108A, 112, in turn spaced apart by a screening member 118. The bridging members may be coupled to the front lateral member 150, for example, by machine screws 144. The screening member 118 may comprise, for example, EMI shielding materials for example perforated sheet metal stock, including apertures 119 large enough to promote sufficient flow for cooling air directed therethrough, while small enough to meet EMI shielding requirements for a given maximum frequency of operation. The rear cover 104A likewise includes first and second rear lateral members 152A, 152B, first and second bridging members 110A, 114 and a screening member 118. The lengths of the front and rear covers are determined by the length of the side panels 102A, 102B, and by the position of the backplane within the card cage 100.

Optional mounting rails 116 are adapted to couple to the front and/or rear edges of the side panels 102A, 102B along slot 117. Apertures 181 in the mounting rails 116 are configured according to standard industry practices to allow for mounting of the chassis to a fixed frame.

An advantage of the present configuration over conventional architectures is that the side panels 102A, 102B can be formed simply as flat panels, cut and punched to provide all needed apertures, thereby eliminating the need for rolling and/or bending of the side panels. Similarly, the lateral members 150A, 150B, 152A, 152B are also similar in structure and therefore can be formed, for example, extruded, in a single piece and cut to suitable dimensions. Once cut, holes for screws 144 and captive nuts 122, 142 can be machined or otherwise formed as needed.

Figure 2:
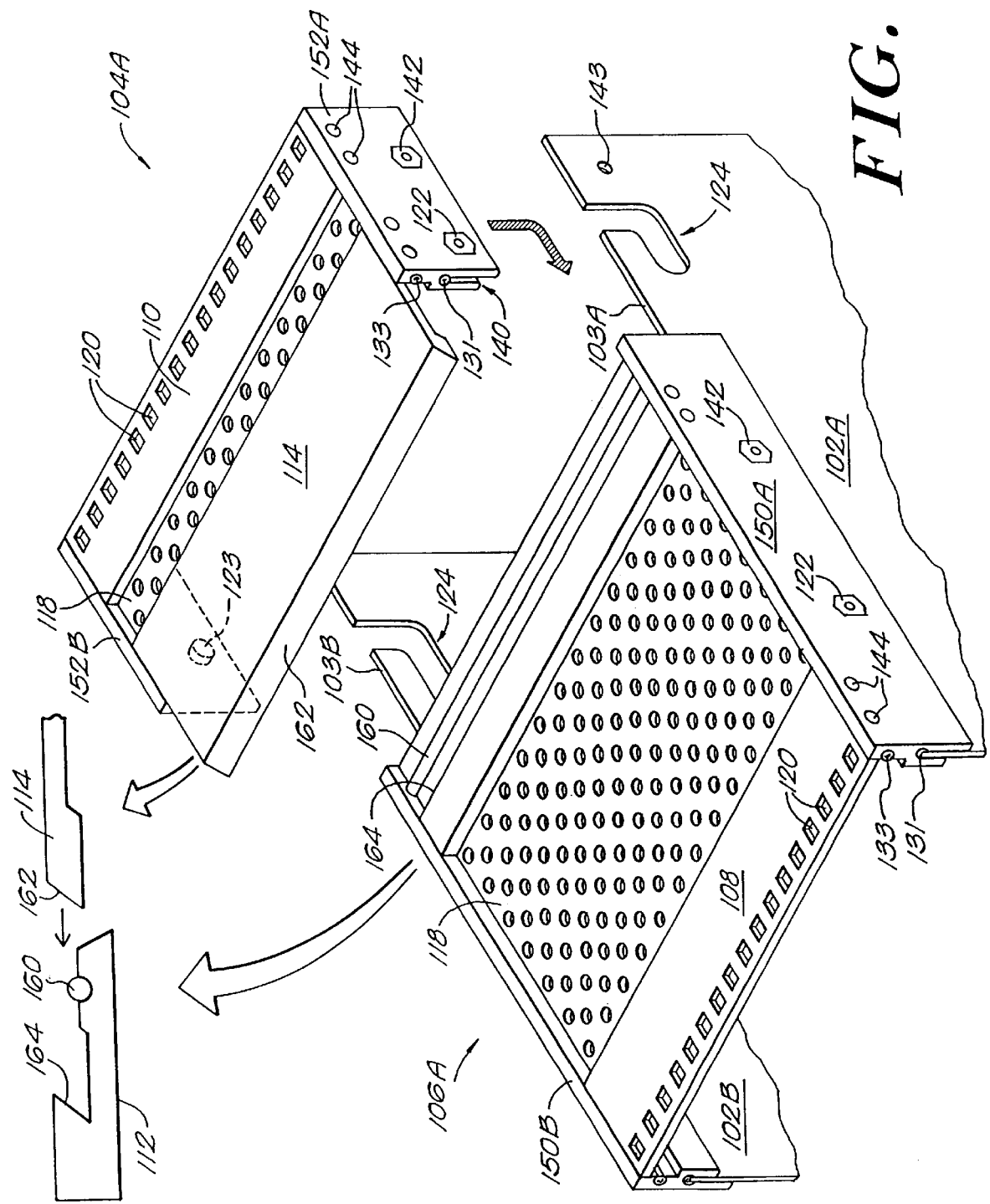
FIG. 2 is a close-up perspective view of a rear cover being mounted to the card cage assembly of FIG. 1, in accordance with the present invention.

FIG. 2 is a close-up perspective view of a rear cover 104A being mounted to the card cage assembly. A front cover 106A was previously mounted to side panels 102A, 102B, preferably in the same manner as the rear cover 104A described below. The front cover 106A includes lateral members 150A, 150B, and first and second bridging members 108, 112 spaced apart by screening member 118. As visible in FIG. 2, bridging member 112 includes a bridging gasket 160 across its length adapted to contact an undersurface of bridging member 114 of the rear cover 104A, as described below, thereby effecting seamless EMI shielding continuity across the surfaces of the front and rear covers.

As described above, the rear cover 104A includes first and second lateral members 152A, 152B, and first and second bridging members 110, 114 spaced apart by screening member 118. The bridging members 110, 114 are attached to the lateral members 152A, 152B, for example, by means of machine screws 144. The screening member 118 is slightly longer in length than the bridging members 110, 114, so as to communicate with an EMI gasket 133, for example a tubular EMI gasket manufactured by Schlegel Corporation formed of high-resiliency polyurethane foam having silver, copper, or nickel/copper cladding, inserted in the respective slots 140 of each lateral member 152A, 152B. In this manner, adequate EMI screening is preserved across the length of the screening member 118.

In alternative embodiments, the bridging members 110, 114 may likewise be formed to be mountable in groove 133, or may be adapted to rest on seat 134 as shown and described in FIG. 3 below. The bridging members 110, 114 may likewise include a recess or groove along their sides suitable for receiving screening member 118. In this embodiment, EMI gasketing material, for example, tubular EMI gasket, may be inserted in the groove to ensure shielding continuity between the bridging members 110, 114 and the shielding member 118.

Bridge members 108 and 110 may further be formed with a recess feature for positioning a nut bar adapted for mating with screws on the front panels of the daughter cards, for securing the daughter cards to the card cage, in accordance with industry standards. Similarly, bridge member 112 may be formed with such a recess for positioning a nut bar adapted for securing a backplane (not shown) to the card cage. In alternative embodiments, the backplane may be mounted to a cross member, in turn mounted to the side panels at screws 102A, 102B at screws 145 (see FIG. 1).

The bridging members 108, 112, 114, 110, preferably further include a recess on their undersurfaces adapted for receiving a spacer strip for card guides to be mounted thereon, according to industry standards. Alternatively, the bridging members 110, 114 and screening member 118 can be formed as an extrusion in a single unit and mounted between the lateral members 152A, 152B. The lateral members 152A, 152B may optionally be formed in unity with the bridging member extrusion such that the front and rear covers 104A, 106A, respectively, may each be formed as a single molded unit.

As shown in FIG. 2, a front cover 106A was previously mounted to the top of side panels 102A, 102B, and assuming a matching cover placed on the underside of the side panels, the covers serve to provide lateral rigidity to the card cage. Captive nuts 142 on lateral members 150A, 150B, 152A and 152B are designed to receive a machine screw from an inner portion of the cage through apertures 143 thereby fixing the covers 106A, 104A to the card cage.

Figure 4:
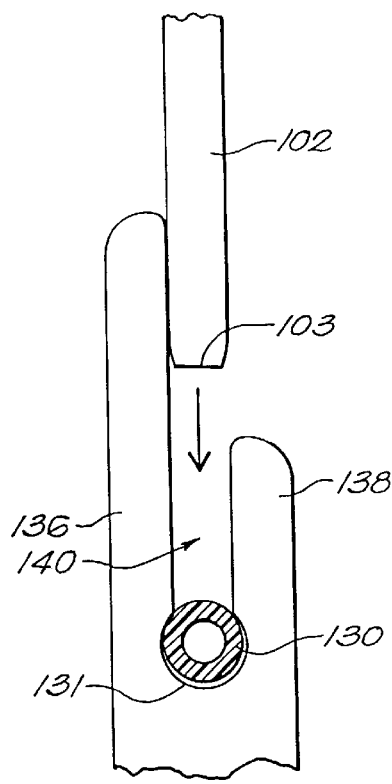
FIG. 4 is a side illustration of the interaction of a pin on the lateral member being inserted into a channel on the side panel for seating a front or rear panel cover, in accordance with the present invention.
Figure 4:
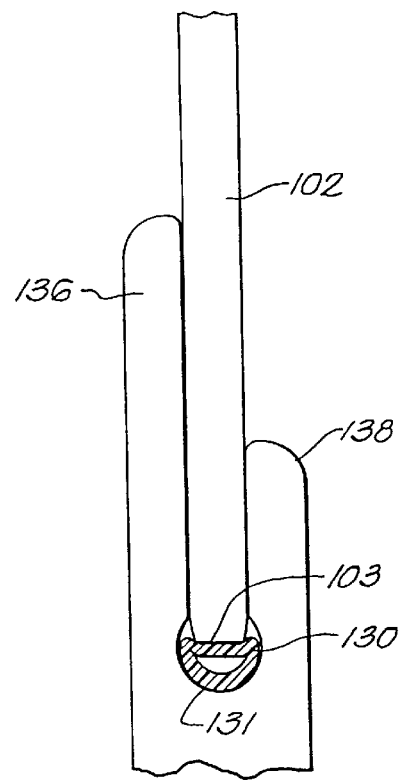
Figure 4:
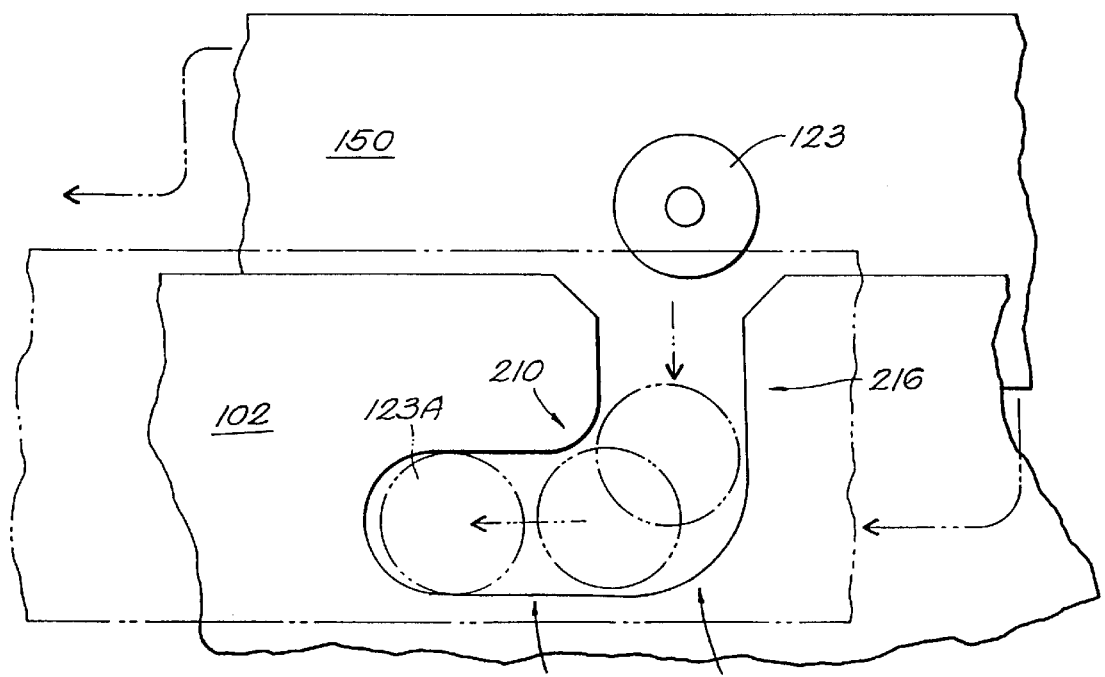

As stated above, rear cover 104A is preferably configured to be seated on the upper edges 103A, 103B of side panels 102A, 102B. The upper edges 103A, 103B rest in slots 140 formed in the lateral members 152A, 152B and come in contact with EMI gaskets 131, for example tubular gaskets, embedded within the slot 140. Captive nut 122 secures a pin located on the inner surfaces of the lateral members 152A, 152B, the pin being adapted to slide in a dog-legged channel 124 formed at the top and bottom edges of the side-plates 102A, 102B. In this manner, the rear cover 104A is positioned such that the pin 123 is first guided into a vertical portion 216 of the channel 124 and then slid forward and seated into position in a horizontal portion 218 of the channel 124, as shown in FIG. 4. The relative positions of the pin 123 and channel 124 are such that the pin 123 cams itself into the channel 124 as it is guided around the bend 210 in the channel 124, providing a smooth transition, and compressing the EMI gaskets 131. Returning to FIG. 2, as the rear cover is urged forward such that the pin 123 is positioned in its final resting place 123A, bridging member 114 of the rear cover 104A comes in contact with bridging member 112 of the front cover 106A such that an undersurface of bridging member 114 of the rear cover 104A is urged against the bridging gasket 160 mounted on bridging member 112 of the front panel 106A.

To further enhance seating of the rear cover, bridging member 114 is preferably provided with a chamfered surface 162 (see inset of FIG. 2) that corresponds with an overlap knife-edge surface 164 on bridging member 112 of the front cover. In this manner, as the rear cover 104A is pushed horizontally into place along channel 124, the knife-edge 164 further serves to urge the chamfered surface 162 in a downward motion, thereby enhancing contact between bridging member 114 of the rear cover 104A and the bridging gasket 160 along bridging member 112 of the front cover 106A.

In a preferred embodiment, the bridging gasket 160 comprises a resilient gasket material, for example, a tubular EMI gasket that has spring-like qualities along its lateral surface, and therefore tends to mitigate vibration of the front 106A and rear 104A covers relative to each other. Additionally, gasket material embedded in the lateral members 150A, 150B, 152A, 152B further enhances EMI shielding continuity, and further reduces vibration in the chassis, as described below.

Figure 3:
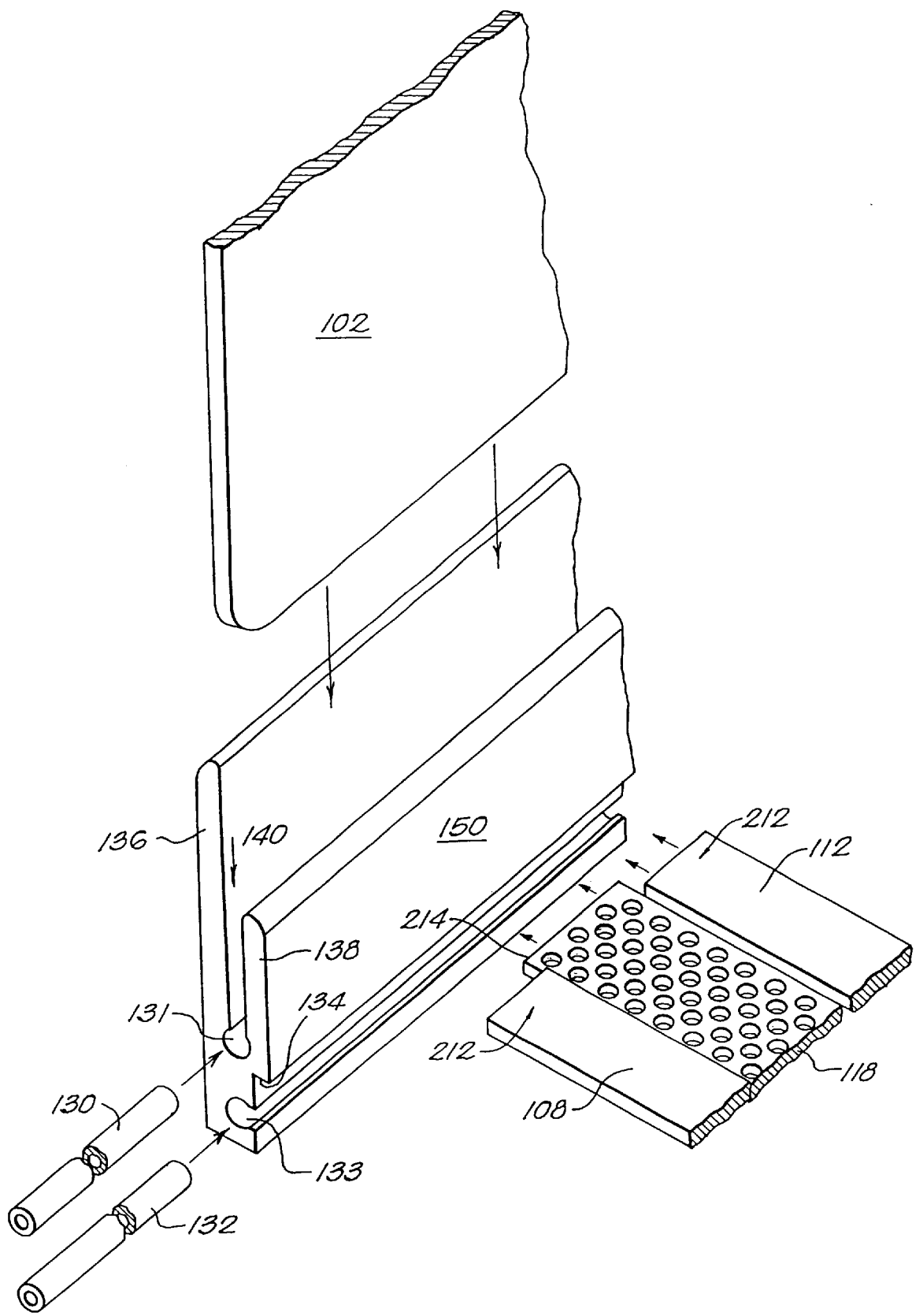
FIG. 3 is a close-up perspective view illustrating the physical coupling of a lateral number with a side panel and with a bridging member, in accordance with the present invention.

FIG. 3 is a close-up perspective view illustrating the coupling of a lateral member 150 with a side panel 102 and with a bridging member, for example, bridging members 108, 112 and screening member 118. As shown in FIG. 3, lateral member 150 includes a slot 140 formed between outer and inner extensions 136, 138 respectively, of the lateral member. The slot 140 is configured to slidably receive an edge of the side panel 102. The extensions 136 and 138 are preferably of unequal lengths as shown, so as to assist the guiding of a cover unit formed with such a lateral member, onto the side panel 102. At least one of the extensions 136, 138 preferably extends across a portion of the side panel, when seated thereon so as to enhance lateral stability of the card cage.

EMI gasketing material, for example, tubular gasket 130, is disposed in the terminus of the slot 140 so as to communicate with an edge 103 of the inserted side panel 102. A longitudinal bore 131 may be formed in the terminus of the slot 140 so as to receive the tubular gasket 130. As shown in FIGS. 5A and 5A, which are side views respectively of the interface of the lateral member 150 and the side panel 102, the slot 140 is preferably of a width slightly larger than the width of the side panel 102. As shown in FIG. 5A, the side panel 102 is positioned into the slot 140, about to come into contact with tubular gasket 130 positioned in bore 131.

As shown in FIG. 5B, when the cover is set into position, the edge 103 of the side panel 102 communicates with tubular gasket 132, formed of a resilient, yet deformable, material, so as to enhance EMI contact therebetween. Pressure against the gasket 130 by the edge 103 of the side panel 102 further serves to urge the gasket 130 against the inner walls of the bore 131, thereby ensuring EMI shielding continuity between the side panel 102 and the lateral member 150.

Similarly, as shown in FIG. 3, during assembly of the cover, an undersurface 212 of each bridging member 108, 112 is made to rest on seat 134, and fixed into place by machine screws 144 shown in FIGS. 1 and 2. The lateral member 150 further includes a groove 133 adapted for receiving a continuous EMI gasket, for example, the tubular EMI gasket 132 described above. In this manner, a forward edge 214 of the screening member 118 is urged against the tubular gasket 132, which is, in turn, pressed against the inner walls of the groove 133, thereby ensuring continuous EMI shielding between the shielding member 118 and the lateral member 150. As described above, the bridging members 108, 112 can be formed or positioned so as to likewise be seated within groove 133 along with the screening member 118 to ensure shielding continuity along the bridging members.

Returning to FIG. 1, an EMI gasket 234, may further be located along the inner surfaces of the side plates 102A, 102B, proximal to the front and rear openings of the card cage, so as to interface with the daughter card front panels, thereby ensuring EMI shielding continuity along the front and rear openings of the card cage. The side panel EMI gasket is preferably tubular in shape and embedded in a member 234 in turn mounted to the side panel to ease installation. Other configurations are equally applicable to the present invention.

In this manner, a card cage is formed in a relatively simple and efficient operation. In a preferred embodiment, the side panels arc flat and therefore easy to manufacture, while the lateral members themselves become key components to assembly and, as described above, can all be formed as a single extrusion, and cut to length and drilled as needed. Continuous EMI shielding is ensured on all side, top and bottom surfaces, at the front and rear openings by including embedded continuous gasketing along the edges of the side panels, and along the edges of the shielding and bridging members. The embedded and captured gaskets are highly resilient and help to dampen vibration in the unit. The press-fit cover cams itself into position and locks into place in a quick installation that is structurally sound. The covers are removable to promote access to the rear and/or front surfaces of the backplane installed therein. In this manner, the present invention provides a simple, and structurally sound card cage having improved EMI shielding, and enhanced backplane accessibility, while maintaining a relatively simplified assembly procedure.

While this invention has been particularly shown and described with references to preferred embodiments thereof, it will be understood by those skilled in the art that various changes in form and in details may be made therein without departing from the spirit and scope of the invention as defined by the appended claims.

For example, the embedded gasket material described above may comprise a gasket having a U-shaped cross section or other metallic ribbon gaskets commonly used in the industry. One of the top or bottom covers may comprise a single unitary piece extending both in front of, and rearward of, the backplane, for example, where access to the backplane is not required from the bottom of the chassis. Furthermore, while the embodiment described above employs a mating pin and channel for positioning and locking the covers into place on the side panels, other securing means are equally applicable to the present invention.

We claim:

1. A card cage comprising:
   first and second side panels;
   top and bottom covers for forming said card cage with said first and second side panels, said top and bottom covers adapted for removably mounting to said side panels for providing lateral rigidity to said card cage; and
   at least one of said top and bottom covers comprising a front portion and a rear portion, said front portion separable from said rear portion such that one of said front and rear portions is removable from said side panels, while the other of said front and rear portions provides said lateral rigidity, wherein said front and rear portions each comprise lateral members for coupling said cover to said side panel and a bridging member coupled between said lateral members.

2. The card cage of claim 1 wherein said bridging member comprises first and second bridging members spaced apart by a screening member.

3. The card cage of claim 2 wherein at least one said bridging member includes inserter/extractor leveraging apertures.

4. The card cage of claim 2 wherein the screening member comprises EMI screening having apertures to permit air flow therethrough.

5. The card cage of claim 1 wherein the lateral members comprise:
   a slot for seating said lateral member on an edge of said side panel; and
   a seat parallel to said slot, and orthogonally oriented relative to said slot for seating a surface of said bridging member.

6. The card cage of claim 5 further comprising a face parallel to said slot including mounting features for mounting said lateral member to said side panel.

7. The card cage of claim 5 wherein the seat and slot are adapted for receiving an EMI gasket.

8. The card cage of claim 7 wherein the EMI gasket comprises continuous tubular gasket.

9. The card cage of claim 1 wherein the bridging member of at least one of said front and rear portions includes an EMI gasket substantially continuous across a portion of the interface of the front and rear portions.

10. The card cage of claim 9 wherein a leading edge of the rear portion and a corresponding leading edge of the front portion overlap to further urge their mutual contact at the EMI gasket.

11. A card cage having substantially continuous EMI shielding comprising:
    first and second side panels; and
    top and bottom covers for forming said card cage with said first and second side panels, said top and bottom covers adapted for removably mounting to said side panels for providing lateral rigidity to said card cage, said covers comprising:
    lateral members for coupling said cover to said side panel, said lateral members adapted for interfacing with features of said side panels along the lengths of said lateral members so as to provide substantially continuous EMI shielding continuity therebetween; and
    a bridging member coupled between said lateral members, said bridging member adapted for interfacing with features of said lateral members along the length of their intersection so as to provide substantially continuous EMI shielding continuity therebetween.

12. The card cage of claim 11 wherein at least one of the top and bottom covers comprise a front portion and a rear portion, said front and rear portions being separable from each other such that one of said front and rear portions is removable from said side panels, while the other of said front and rear portions provides said lateral rigidity.

13. The card cage of claim 12 wherein the lateral members comprise:
    a slot for seating said lateral member on an edge of said side panel; and
    a seat parallel to said slot, and orthogonally oriented relative to said slot for seating a surface of said bridging member.

14. The card cage of claim 13 wherein the seat and slot are adapted for receiving an EMI gasket.

15. The card cage of claim 14 wherein the EMI gasket comprises continuous tubular gasket embedded in the slot.

16. The card cage of claim 12 wherein the bridging member of at least one of said front and rear portions includes an EMI gasket substantially continuous across a portion of the interface of the front and rear portions.

17. A member for coupling a cover and side panel of a card cage comprising:

- a body extending along a longitudinal axis of said member;
- a slot formed in said body parallel to said longitudinal axis, receiving an edge of a side panel;
- a seat parallel to said longitudinal axis, receiving a cover positioned orthogonal to said side panel; and
- a locking feature comprising a pin, removably securing said member to an L-shaped channel in said side panel.

18. The member of claim 17 wherein said slot includes a bore at a terminus of the slot adapted to receive a resilient EMI gasket to be embedded in said slot.

19. The member of claim 17 wherein said seat includes a groove for receiving an edge of said cover.

20. The member of claim 19 wherein said groove includes a bore at a terminus of the groove adapted to receive a resilient EMI gasket to be embedded in said groove.

* * * * *